US012249504B2

(12) United States Patent
Goller et al.

(10) Patent No.: US 12,249,504 B2
(45) Date of Patent: Mar. 11, 2025

(54) MANUFACTURING AND REUSE OF SEMICONDUCTOR SUBSTRATES

(71) Applicant: Infineon Technologies AG, Neubiberg (DE)

(72) Inventors: Bernhard Goller, Villach (AT); Alexander Christian Binter, Villach (AT); Tobias Hoechbauer, Villach (AT); Martin Huber, Villach (AT); Iris Moder, Villach (AT); Matteo Piccin, Villach (AT); Francisco Javier Santos Rodriguez, St Jakob im Rosental (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 204 days.

(21) Appl. No.: 17/743,006

(22) Filed: May 12, 2022

(65) Prior Publication Data

US 2023/0127556 A1    Apr. 27, 2023

Related U.S. Application Data

(60) Provisional application No. 63/270,599, filed on Oct. 22, 2021.

(51) Int. Cl.
*H01L 21/02* (2006.01)
*H01L 21/288* (2006.01)
*H01L 21/78* (2006.01)

(52) U.S. Cl.
CPC .... *H01L 21/02293* (2013.01); *H01L 21/0203* (2013.01); *H01L 21/288* (2013.01); *H01L 21/7806* (2013.01)

(58) Field of Classification Search
CPC ................ H01L 21/7806; H01L 21/7813
See application file for complete search history.

(56) References Cited

U.S. PATENT DOCUMENTS 6,326,279 B1    12/2001  Kakizaki et al.
9,884,389 B2     2/2018  Hirata et al.
(Continued)

FOREIGN PATENT DOCUMENTS

JP       6678522 B2    3/2020
WO    2015031444 A1    3/2015

OTHER PUBLICATIONS

"Nuts Opening Machine", https://www.food-machine.org/nut-processing-machines/nut-opening-machine.html, Sep. 22, 2021, 1-5.
(Continued)

*Primary Examiner* — Erik Kielin
(74) *Attorney, Agent, or Firm* — Murphy, Bilak & Homiller, PLLC

(57) ABSTRACT pa The method of processing a semiconductor wafer includes forming one or more epitaxial layers over its first main surface. It also involves forming one or more porous layers within the semiconductor wafer or within the epitaxial layers. Together, the semiconductor wafer, the epitaxial layer(s), and the porous layer(s) form a substrate. Next, doped regions of a semiconductor device are formed within the epitaxial layer(s). After forming these doped regions, a non-porous part of the semiconductor wafer is separated from the rest of the substrate along the porous layer(s).

29 Claims, 7 Drawing Sheets

(56) References Cited

U.S. PATENT DOCUMENTS

| | | | |
|---|---|---|---|
| 10,468,304 B1 | 11/2019 | Seddon | |
| 2001/0019153 A1 | 9/2001 | Sato et al. | |
| 2002/0153595 A1* | 10/2002 | Tayanaka | H01L 21/76259 |
| | | | 257/E29.082 |
| 2004/0055894 A1* | 3/2004 | Iwasaki | H01L 21/76259 |
| | | | 257/E21.216 |
| 2006/0234477 A1* | 10/2006 | Gadkaree | H01L 21/76259 |
| | | | 257/E21.57 |
| 2014/0252373 A1 | 9/2014 | Mauder et al. | |
| 2016/0293714 A1* | 10/2016 | Hutzler | H01L 29/0615 |
| 2019/0296125 A1* | 9/2019 | Schulze | H01L 21/02447 |
| 2019/0363057 A1* | 11/2019 | Santos Rodriguez | H01L 23/16 |
| 2020/0211850 A1 | 7/2020 | Donofrio et al. | |
| 2020/0286730 A1 | 9/2020 | Moder et al. | |
| 2020/0365385 A1 | 11/2020 | Goller et al. | |
| 2021/0175123 A1 | 6/2021 | Beyer et al. | |
| 2021/0265484 A1 | 8/2021 | Schulze et al. | |

OTHER PUBLICATIONS

Yonehara, et al., "ELTRAN: Novel SOI Wafer Technology", JSAP International No. 4, Jul. 2001, pp. 10-16.

* cited by examiner

MANUFACTURING AND REUSE OF SEMICONDUCTOR SUBSTRATES

BACKGROUND

Wafer costs for semiconductor devices grown on a silicon carbide wafer/base material tends to be high, where 'silicon carbide wafer/base material' refers to the growth substrate onto which epitaxial semiconductor layers are grown. In contrast, 'substrate' may be or may include a wafer and, optionally, epitaxial layers and metallization layers. Such semiconductor devices may be based on silicon carbide (SiC) or on other materials that can be grown on SiC (e.g., GaN, GaAs, etc.).

Wafer costs make up a significant ratio of the overall production costs of semiconductor devices grown on SiC. Therefore, reducing these costs results in a competitive advantage. One way to reduce wafer costs is to reduce material losses of the wafer material during manufacturing, for example, by using a standard wafer several times and/or by reducing losses during wafer manufacturing.

SUMMARY

According to an embodiment of a method of processing a semiconductor wafer, the method comprises: forming one or more epitaxial layers over a first main surface of the semiconductor wafer; forming one or more porous layers in the semiconductor wafer or in the one or more epitaxial layers, wherein the semiconductor wafer, the one or more epitaxial layers and the one or more porous layers collectively form a substrate; forming doped regions of a semiconductor device in the one or more epitaxial layers; and after forming the doped regions of the semiconductor device, separating a non-porous part of the semiconductor wafer from a remainder of the substrate along the one or more porous layers.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a method for re-use of a semiconductor wafer multiple times, using a porous semiconductor layer for epitaxy and for splitting. Device structures are produced on a pre-processed semiconductor wafer with a porous surface layer. After device manufacturing, the semiconductor wafer is (exfoliated) separated from the remainder of the substrate at the porous layer and re-used.

Figure 1:
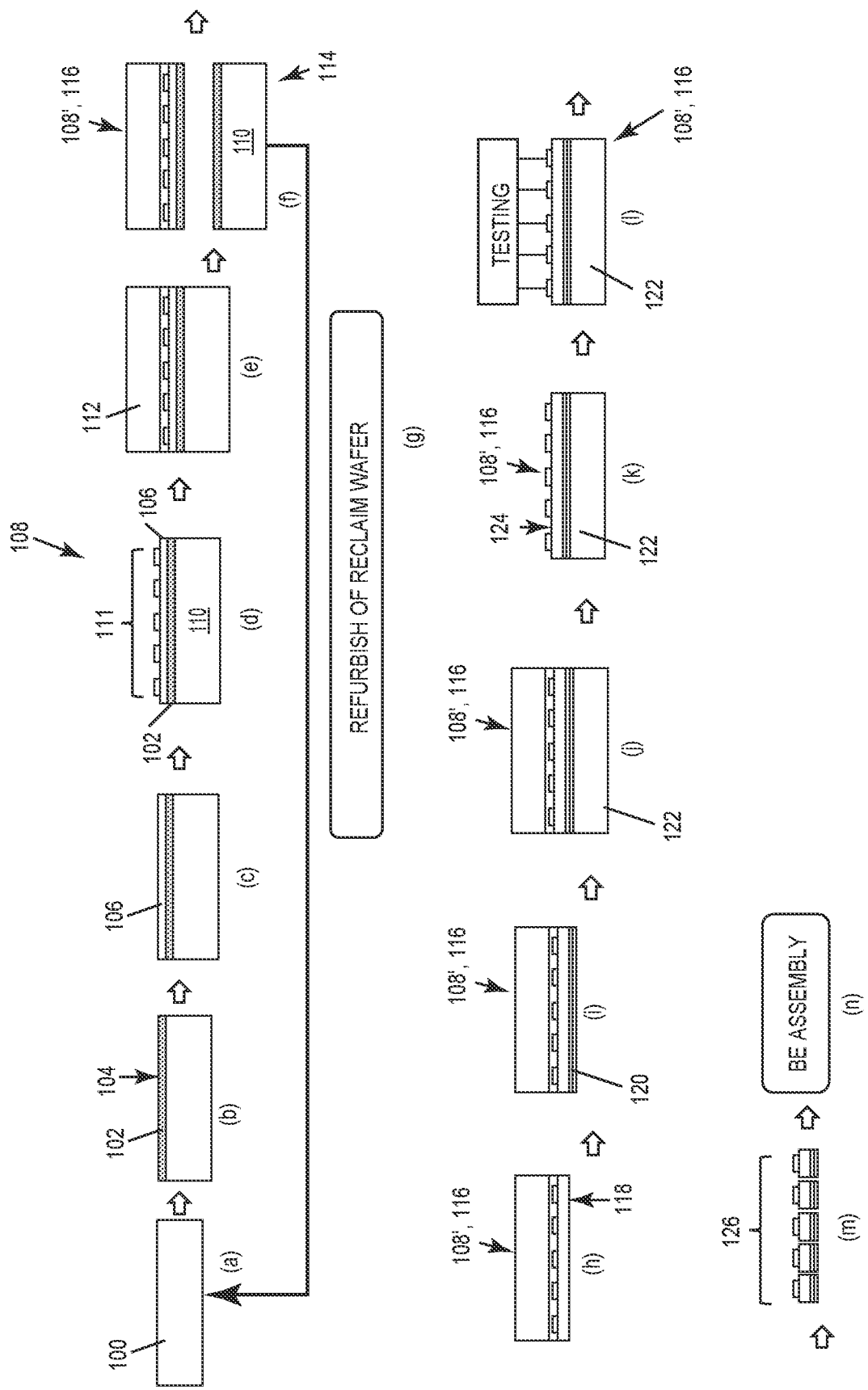
FIG. 1 illustrates a schematic diagram of an embodiment of a method for re-use of a semiconductor wafer.

FIG. 1 illustrates an embodiment of the method. The method includes providing (a) a semiconductor wafer 100 that is ready for subsequent epitaxy. One or more porous layers 102 are formed (b) at and below a first main surface 104 of the semiconductor wafer 100. One or more epitaxial layers 106 are grown (c) on the first main surface 104 (e.g., the frontside) of the semiconductor wafer 100. Frontside processing (d) is then performed up to a certain point, e.g., front-side metallization and/or passivation, to create a substrate 108 that includes a non-porous part 110 of the wafer 100, the one or more porous layers 102, and device structures 111. The device structures 111 may include drain regions, buffer layers, body zones, source zones, emitter zones, gates, current spread layers, etc. formed in the one or more epitaxial layers 106, and frontside metallization, passivation, etc. formed over the one or more epitaxial layers 106.

The method in FIG. 1 further includes attaching (e) a temporary or permanent carrier 112 to the frontside of the substrate 108 to stabilize the substrate 108. The semiconductor wafer 100 is exfoliated (f) by using the one or more porous layers 102 as a separation layer. That is, the non-porous part 110 of the semiconductor wafer 100 is separated from the remainder 108' of the substrate 108 along the one or more porous layers 102. The exfoliation or separation process results in a reclaim wafer 114 and a device substrate 116 which constitutes the remainder 108' of the substrate 108 upon separation.

For the reclaim wafer 114, the reclaim wafer 114 may be refurbished (g) and, optionally, further processed, e.g., to increase the wafer thickness, as explained late herein. The refurbished reclaim wafer 114 may be used again (a->f) to form another device substrate. For the device substrate 116, further processing steps may be carried out such as conditioning (h) the surface 118 of the device substrate 116 defined by the separating from the non-porous part 110 of the semiconductor wafer 100, forming (i) metallization and/or Ohmic contacts 120 at the conditioned backside 118 of the device substrate 116, attaching (j) a carrier 122 to the metallized backside 118 of the device substrate 116, removing (k) the carrier 112 from the frontside side 124 of the device substrate 116, testing (l) the device substrate 116, singulating (m) the device substrate 116 into individual dies (chips) 126 and removing the backside carrier 122, and further backend 'BE' assembly (n) such as plating, etc., e.g., as described in more detail later herein.

Figure 2:
FIG. 2 illustrates a simplified block diagram of the method of FIG. 1.

FIG. 2 illustrates the same method illustrated in FIG. 1, but with less detail. The lettering (a) through (n) used in the figures to denote the different processing steps does not necessarily imply or suggest a required processing order, unless otherwise explicitly stated.

Figure 3:
FIG. 3 illustrates a block diagram of another embodiment of a method for re-use of a semiconductor wafer.

FIG. 3 illustrates another embodiment of the method illustrated in FIG. 1, with the same level of detail used in FIG. 2. In FIG. 3, testing (l) of the device substrate 116 is performed earlier in the process. Particularly, the device substrate 116 is tested (l) before exfoliating/separating (f) the non-porous part 110 of the semiconductor wafer 100 from the remainder 108' of the substrate 108.

Figure 4:
FIG. 4 illustrates a block diagram of another embodiment of a method for re-use of a semiconductor wafer.

FIG. 4 illustrates another embodiment of the method illustrated in FIG. 1, with the same level of detail used in FIG. 2. Like FIG. 3, the device substrate 116 is tested (l) in FIG. 4 before exfoliating/separating (f) the non-porous part 110 of the semiconductor wafer 100 from the remainder 108' of the substrate 108. In FIG. 4, singulating (m) of the device substrate 116 into individual dies (chips) 126 is also performed before exfoliating/separating (f) of the non-porous part 110 of the semiconductor wafer 100 from the remainder 108' of the substrate 108.

The embodiments illustrated in FIGS. 3 and 4 perform device testing before the frontside carrier 112 is attached to the substrate 108. Furthermore, no testing is required after exfoliating/separating (f) of the non-porous part 110 of the semiconductor wafer 100 from the remainder 108' of the substrate 108.

The steps (a) through (n) shown in FIGS. 1 through 4 are described in more detail below.

Step (a): Wafer Preparation

The semiconductor wafer 100 may be crystalline, e.g., monocrystalline or at least partially monocrystalline, e.g., at the frontside surface 104 onto which epitaxy is performed, such that one or more epitaxial layers 106 can be grown with low enough crystal defect density to support device manufacturing. The semiconductor wafer 100 may be a SiC wafer (i.e., may comprise or may consist of SiC), for example, off-axis or on-axis 4H—SiC, 3C—SiC, 6H—SiC, etc. However, the reuse method is not limited to SiC as a wafer material but may also be used for other wafer materials, such as Si, GaN, GaAs, Ga2O3, etc. or for a substrate comprised of two or more layers of different materials. In a top plan view, the semiconductor wafer 100 may have a circular, an elliptical or a polygonal (e.g., rectangular or hexagonal) shape, optionally with a so-called flat or notch. The diameter of the semiconductor wafer 10 may be 100 mm, 150 mm, 200 mm or even larger.

The semiconductor wafer 100 may have a standard thickness. The standard thickness may vary depending on the wafer diameter. Typically, 100 mm and 150 mm wafers (initially) have a thickness of 350 µm (with an accuracy of, e.g., at most±40 µm or at most±25 µm). However, the starting wafer 100 may have a thickness below the standard thickness (e.g., 200 µm for 100 mm or 150 mm wafers). For larger wafer diameters, the standard thickness may be higher to enable mechanical stability of the semiconductor wafer 100 during processing. The semiconductor wafer 100 may, as an alternative, have a smaller thickness or a larger thickness than a standard thickness. For example, the reuse method may begin with a thicker first wafer (e.g., above standard thickness or with standard thickness) and the thickness may be reduced in each cycle of the reclaim steps (a) through (g). That is to say, the reclaim wafer 114 may have a smaller thickness than the initial wafer 100. In the case where the one or more porous layers 102 are formed in the one or more epitaxial layers 106 instead of in the initial wafer 100, the entire semiconductor wafer 100 is non-porous and available for reuse after the exfoliation/separation step (f).

The semiconductor wafer 100 may already be pre-treated to allow for epitaxial growth. However, it may also be possible that preparing the semiconductor wafer 100 for epitaxial growth is required even for the first process cycle. In general, preparing the semiconductor wafer 100 for epitaxial growth may involve at least one of the following processes. A combination of the processes identified below is possible, and some of the processes may fall in two or more of the mentioned categories. The wafer preparing processes are as follows: cleaning; mechanical grinding (polishing); treatment with a jet with fine material (e.g., sand blasting or dry-ice blasting); chemical mechanical polishing (CMP); plasma treatment with chemical and/or mechanical process component such as, e.g., reactive ion-etching, wet etching, e.g., with hot KOH, $KMnO_4$, etc., dry etching, or ion-implantation with subsequent wet etching, e.g., $HF:HNO_3$; laser assisted surface treatment; temperature treatment such as bake in gas atmosphere, e.g., hydrogen or a mix of various gas species or repeated thermal oxidation at about 1200° C. with subsequent oxide removal, e.g., at least a few nanometers (nm) may be removed; and thermal reaction with other materials, e.g., like metals.

Step (b): Porosification

The porous layer(s) 102 are created by porosifying semiconductor material of the semiconductor wafer 100 or of the one or more epitaxial layers 106. The porosification process may be influenced by the doping concentration of the semiconductor material to be porosified. For example, higher doping concentration may result in higher porosity. The desired doping concentration may be provided by at least one of the initial substrate doping and by implantation steps with a subsequent temperature treatment. For example, the doping concentration of the semiconductor material to be porosified may be modified by adjusting one or more of implantation energies, implantation angles, and channeling implants. In another approach, the doping concentration of the semiconductor material to be porosified is modified by varying a vertical doping concentration and/or a lateral doping concentration of the semiconductor material to be porosified.

Porosity is a combination of the pore density in the semiconductor material and the pore size (e.g., pore diameter). A larger porosity may result from a lower pore density in combination with a larger pore size or from a higher pore density in combination with a lower pore size, or even both: a combination of a higher pore density and a larger pore size. The semiconductor wafer 100 may be porosified before epitaxial growth or the epitaxial layer(s) 106 may be grown on the wafer 100 and one or more these layers are then porosified.

Figure 6:
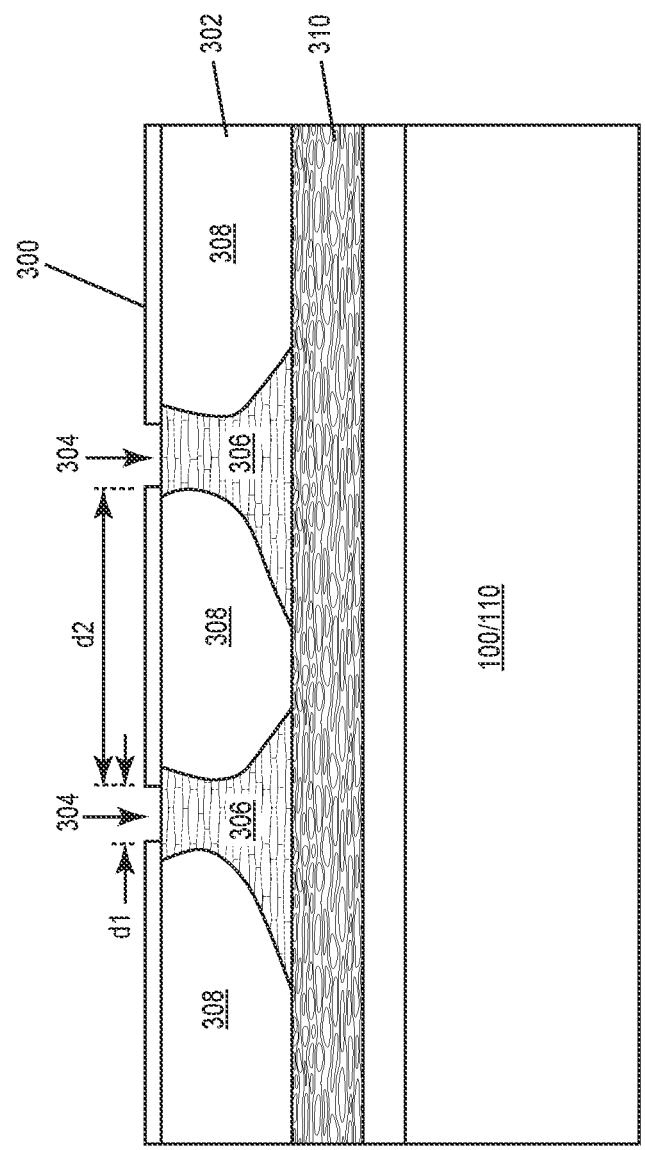
FIG. 6 illustrates a partial cross-sectional view of another embodiment of a porosified layer for exfoliation/separation of a semiconductor wafer.

The porosified layer(s) 102 may have varying doping concentrations in a (vertical) direction perpendicular to the first main surface 104 of the semiconductor wafer 100 and/or in a (lateral) direction parallel to the first main surface 104 of the semiconductor wafer 100. This allows for creating a stack of multiple porosified layers 102 with different pore size, e.g., as shown in FIG. 6. Such a varying doping concentration can be created, e.g., by tuning the doping concentration during the epitaxial growth process. Alternatively or additionally, the varying doping concentration can be created by implanting dopants into the semiconductor wafer 100 and/or the epitaxial layer(s) 106.

The semiconductor material may be porosified, e.g., by an anodic porosification process. Typically, anodic porosification takes place in electrolytic solution which may, e.g., comprise acidic, alkaline or salts components, and which may optionally comprise further additives. e.g., surfactants such as IPA, ethanol, etc. For example, the electrolytic solution may be or may comprise a fluorine-based chemistry (e.g., aqueous HF solution) or an alkaline etch chemistry (e.g., TMAH, KOH). The anodic porosification process can be driven by exposure to UV (ultraviolet) radiation. The porosification can also be performed in a so-called 'breakdown' region, where charge carriers are induced via high enough electric field. Other additives in the etch chemistry influence etch rate and porosity.

The pores constitute voids in the semiconductor material. The porosity can vary with depth depending on porosification conditions. For example, porosity may be varied by varying a current and/or a voltage of the electrochemical process and/or a composition of the electrolytic solution. The semiconductor material is weakened by the pores (voids) such that sufficient stress can be generated for splitting the substrate 108 at the weakened (porosified) part. The porosity (e.g., density and size of pores), however, should be sufficiently low that all subsequent process steps can be performed without initiating local or full delamination of the porous layer(s) 102 before the exfoliation/separation step (f). That is to say, the porosity of the porous layer(s) 102 should be high enough to ensure good exfoliation properties but low enough to avoid flaking-off of the porous layer(s) 102. For example, the porous layer(s) 102 used for exfoliation should have a high porosity (e.g., the highest porosity in the stack). In addition or as an alternative, the porous layer 102 used for exfoliation may have a pore structure (e.g., pore arrangement or distribution) such that the porous layer 102 is the weakest porous layer in the stack. For example, in this porous layer 102, the pores combined may occupy at least the same amount of space or more space than the non-porous regions surrounding the pores (e.g., on average, the distance between the pores is smaller than the diameter of the pores). Depending on the arrangements of the pores, for larger pores, a lower pore density may be sufficient, while smaller pores might require a high pore density.

In one embodiment, one or more semiconductor layers 106 are epitaxially grown on the porous layer(s) after the porosification step (b). The surface of the uppermost porous layer 102 therefore should allow for a high quality of the epitaxial layer(s) 106. For this, the uppermost porous layer 102 should have a high crystal quality. This can be ensured by making use of a so-called skin layer. Such a skin layer occurs during porosification and is a very thin surface layer with very low pore density compared to the porosified layer underneath. The skin layer may have the following properties: monocrystalline; low surface roughness; small pore diameter (preferably below 200 nm, e.g. below 100 nm, e.g. below 70 nm; e.g. ~50 nm); small pore density. For example, in the case of pore density, the distance between pores on average may be larger than the diameter of the pores such that the pores (voids) occupy less space than non-porous regions. Regarding porosity, the pores may occupy less than 50% of the space of the non-porous regions). A naturally occurring skin layer is very thin (e.g., 20-50 nm) and can be inhomogeneous. The thickness and homogeneity of the skin layer may be influenced as explained in the following.

Figure 5:
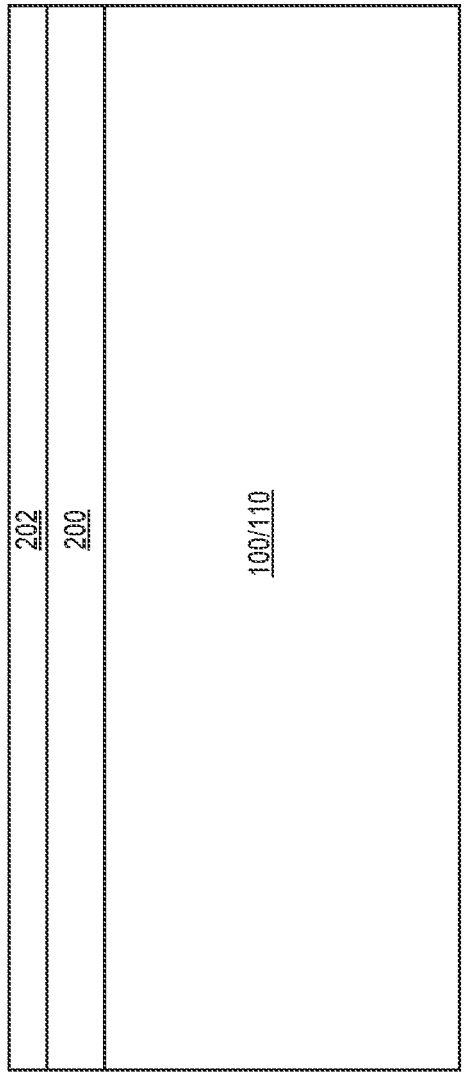
FIG. 5 illustrates a partial cross-sectional view of an embodiment of a porosified layer for exfoliation/separation of a semiconductor wafer.

FIG. 5 illustrates an embodiment according to a porosified layer 200 for exfoliation/separation is formed on or in the semiconductor wafer 100 and a skin layer 202 is formed on the porosified exfoliation/separation layer 200. The thickness of the skin layer 202 may be in the range of 100 nm to 500 nm, for example. The thickness of the porosified exfoliation/separation layer 200 may be in the range of 1 μm to 10 μm, for example. Such a layer stack may be realized by forming layers with different average doping concentrations, since porosification by electrochemical etching is greatly accelerated with increasing doping concentration. Accordingly, the skin layer 202 may have a higher average doping concentration than the non-porous part 100 of the semiconductor wafer 100 and the porosified exfoliation/separation layer 200 may have a higher average doping concentration than the skin layer 202. For example, the non-porous part 100 of the semiconductor wafer 100 may have an average doping concentration of about 5e18 $cm^{-3}$, the porosified exfoliation/separation layer 200 may have an average doping concentration of about 1e20 $cm^{-3}$, and the skin layer 202 may have an average doping concentration of about 1e17 $cm^{-3}$.

The areas with different doping shown in FIG. 5 may be structured or may have a varying thickness over the semiconductor wafer 100, as required by an individual application. The different doping regions may be provided via implantation and/or during epitaxy. For example, different doping regions may be provided by: (i) locally compensating n-doping in the surface layer 202 by acceptor implantation or by implanting impurities with deep energy levels such as vanadium and/or titanium impurities; (ii) increasing n-doping in the layer 200 to be porosified by donor implant; and/or (iii) implantation and electrically directed diffusion.

In addition or as an alternative, FIG. 6 illustrates an embodiment according to which a patterned mask 300 is used on a low-doped (e.g., about 1e17 $cm^{-3}$) semiconductor layer 302. The mask 300 may, e.g., be a nitride mask (which is preserved longer) or a resist mask (which is removed before finishing the entire porosification step). The mask 300 may have openings 304 having a width or diameter d1 in the range of 100 nm and a distance d2 between the openings 304 in the micron (μm) range. Applying an electric field accelerates vertical porosification in regions 306 where the dopants were implanted. In low-doped regions 308 shielded by the mask 300, porosity is applied along the field lines and in this case, field peaks and the surface should not undergo further porosification whereas an underlying layer 310 which is doped more heavily (e.g., about 1e20 $cm^{-3}$) also has a higher porosification. By a suitable choice of the doping concentrations and the spacing d2 and width d1 of the mask openings 304, the thickness of the skin layer 302 and thus stability may be specifically controlled.

Electrochemical formation of pores in semiconductor material strongly depends on the applied current. To generate a homogenous porous layer over the whole substrate wafer, the current flowing through the material should be homogenous. For this reason, the pore morphology and depth highly depend on the doping uniformity within the semiconductor material to be porosified. Hence, the porosification of semiconductor material is a process which highly depends on the doping uniformity of the semiconductor material.

Porosification may make use of this dependency on the doping in two ways: (i) creation of a stack of multiple layers with different porosity; and (ii) use of a (low-doped) wafer or a low-conducting layer as an etch stop during pore formation.

Regarding an etch stop, a low conducting epitaxial layer; or a low conducting wafer region; or a low conducting buried wafer region induced by implantation of suitable dopants which result in counterdoping. A well (highly) conducting layer with higher doping concentration may be epitaxially grown on top of the low conducting portion or may be produced via implanting. The well conducting layer enables formation of a homogenous porous layer. Epitaxial material shows less doping variation than the base material, which might open the possibility of achieving homogeneously porous structures by adding a homogeneously doped layer on top of the base material.

Figure 7:
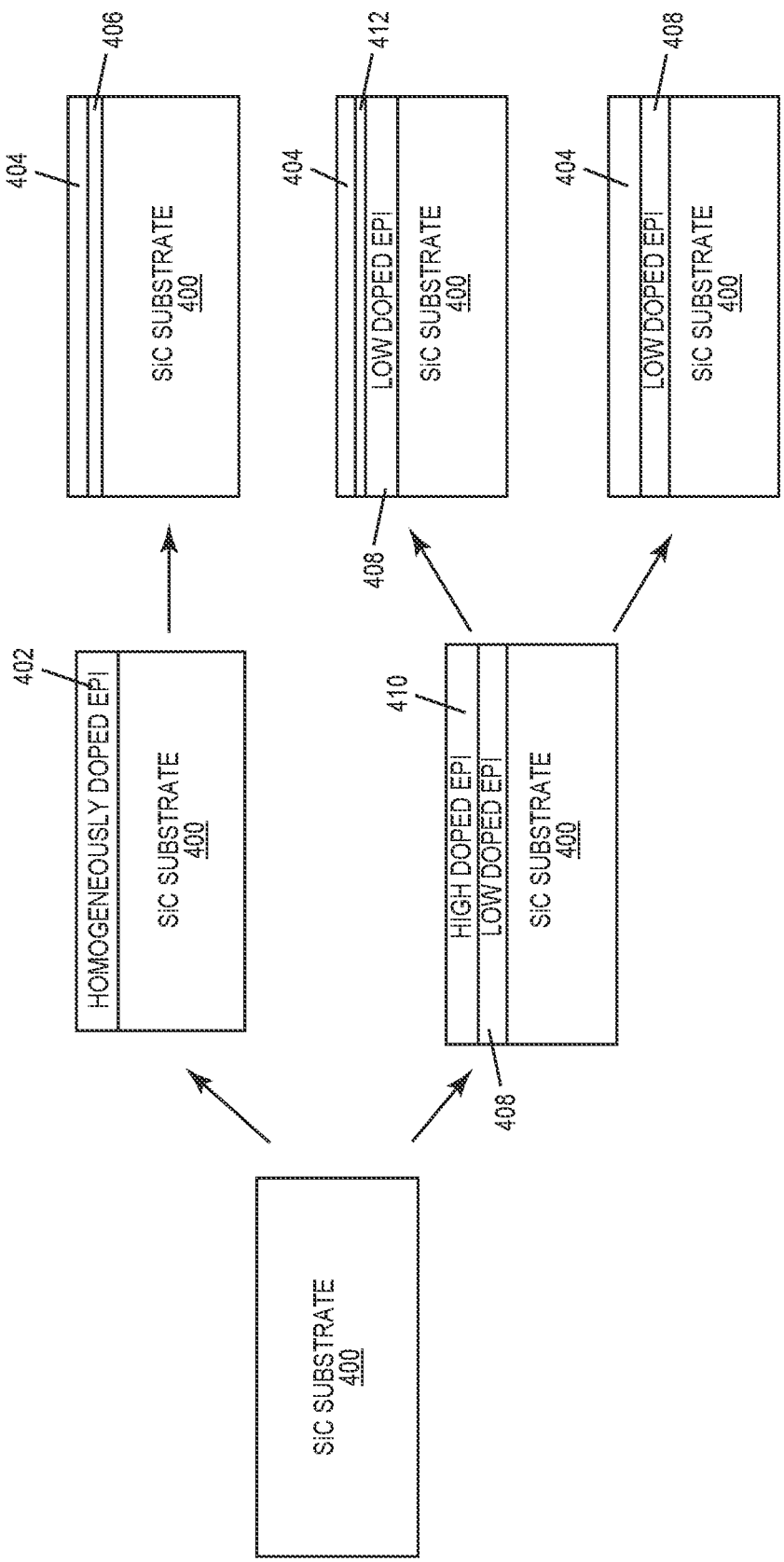
FIG. 7 illustrates respective partial cross-sectional views of different embodiments of forming a homogeneous porous layer for exfoliation/separation of a semiconductor wafer.

FIG. 7 illustrates different embodiments of forming a homogeneous porous layer. The embodiments shown in FIG. 7 are illustrated using a base SiC wafer 400. However, as previously explained, the reuse methods described herein are not limited to SiC as the wafer material but may also be used for other wafer materials, such as Si, GaN, GaAs, Ga2O3, etc. or for a substrate comprised of two or more layers of different materials. According to the embodiments shown in FIG. 7, a thickness variation of the resulting porous layer 102 is $\ll \pm 1$ µm and a homogeneous pore morphology is achieved over the base SiC wafer 400.

In one embodiment, a homogenously doped epitaxial (EPI) layer 402 is grown on the base SiC wafer 400. An upper part of the homogenously doped epitaxial layer 402 is porosified to form a homogenous porous layer 404. A lower part of the homogenously doped epitaxial layer 402 remains non-porous and acts as an etch stop 406.

In another embodiment, a low conducting epitaxial layer, a low conducting wafer region, or a low conducting buried wafer region 408 is formed by induced implantation of dopants which provide counter-doping. A higher conducting layer 410 is formed on the low conducting epitaxial layer, low conducting wafer region, or low conducting buried wafer region 408. The higher conducting layer 410 has a higher average doping concentration than the low conducting epitaxial layer, low conducting wafer region, or low conducting buried wafer region 408. A homogenous porous layer 404 is then formed in the higher conducting layer 410. In one embodiment, a lower part 412 of the higher conducting layer 410 remains non-porous below the homogenous porous layer 404. In another embodiment, the entire higher conducting layer 410 is converted to the homogenous porous layer 404. In either case, the low conducting epitaxial layer, low conducting wafer region, or low conducting buried wafer region 408 acts as an etch stop.

Regarding a porous multilayer stack, to further control the homogeneity of pore formation, a highly doped semiconductor layer may be epitaxially grown on top of an underlying low doped portion (e.g., layer or wafer). The porosification step (b) is applied to both doped semiconductor layers.

Figure 8:
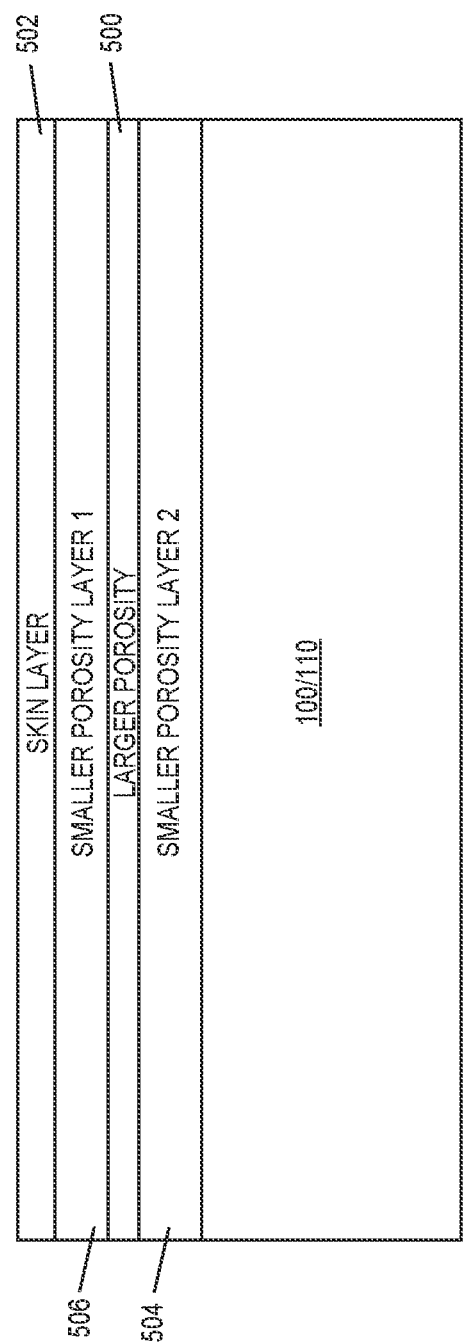
FIG. 8 illustrates a partial cross-sectional view of an embodiment of a porous multilayer stack for exfoliation/separation of a semiconductor wafer.

FIG. 8 illustrates an embodiment of a porous multilayer stack. A first porous layer 500 has an average pore density that is greater than the average pore density of the non-porous part 110 of the semiconductor wafer 100. A second porous layer 502 above the first porous layer 500 has an average pore density that is greater than the average pore density of the non-porous part 110 of the semiconductor wafer 100 and less than the average pore density of the first porous layer 500. In one embodiment, the second porous layer 502 is a skin layer as described herein. An additional porous layer 504 may be formed below the first porous layer 500 and have an average pore density that is greater than the average pore density of the non-porous part 110 of the semiconductor wafer 100 and less than the average pore density of the first porous layer 500. Separately or in combination, an additional porous layer 506 may be formed between the first porous layer 500 and the second porous layer 502 and having an average pore density that is greater than the average pore density of the second porous layer 502 and less than the average pore density of the first porous layer 500.

In addition or as an alternative to the porosification embodiments described above, a lateral variation of the doping may be performed in the layer 120 to be porosified adjacent to the surface of that layer 102 by means of a masked implantation. For example, an increased doping may be generated in the region of the mask openings 304 shown in FIG. 6 to accelerate the vertical porosification rate in the exposed regions 306. The mask openings 304 may, e.g., have a stripe or hole shape, whereby the spacing d2 and width d1 of the openings 304 may be selected such that largely defect-free epitaxial overgrowth of the porosified layer surface is possible.

Step (c): Epitaxy

Epitaxial growth may be performed on the skin layer of a new wafer or reclaim wafer. Skin layer surface preparation for epi growth compatibility may be either achieved in-situ by a pre-growth etch under the gas flow of one or more different gas species (e.g., hydrogen), or may be achieved through other methods as described above in connection with the wafer preparation step (a). Accordingly, etch removal depth may be limited in a way that part of the skin layer remains on the reclaim wafer throughout its surface area.

The epi process may be tuned such that overgrowth of the pores in the skin layer is provided. After a few layers (e.g., thickness at least twice or at least three times or at least 10 times of the pore size in the skin layer, e.g., below 500 nm or below 300 nm or below 200 nm for a pore diameter of around 50 nm), the epi process conditions may be changed from lateral overgrowth.

The first part of the epi for overgrowing the pores, optionally together with the skin layer and some of the porous layers, may be part of the final device structure, e.g., part of the drain layer, the emitter layer, buffer layer, as described in more detail later herein. The first part of the epi may have varying dopant concentration, e.g., in a lateral direction, which may be seen in the final device. For example, the pore distribution may reflect on the dopant distribution within the first part of the epi. During overgrowth, the dopants may deposit differently in the regions of the pores than outside of the pores. The first part of the epi may also result in a reduction of defects that might, e.g., result in so-called basal plane dislocations in the later epitaxial layers.

The epi layer stack may include the device epi, e.g., including a highly doped drain layer or emitter layer, a buffer layer on the highly doped drain layer or emitter layer, and a drift layer on the buffer layer, etc. The drain/emitter layer, the buffer layer, and the drift layer may each have constant doping concentration levels throughout their respective depths or have doping concentration gradients within their respective layer thicknesses.

The epi may also include a multistack structure, where the first epitaxial layer is followed by the device epi with or without a drain/emitter or buffer layer separating the two layers. The first layers of the epi, including the first part that overgrows the pores, have a high doping level and act as structural support after the exfoliation/separation step (f).

Epitaxy might also be performed on the new or reclaim wafer 100 prior to substrate porosification. In this case, the porosification process is not applied to the semiconductor wafer 100 but rather to the epitaxial layers 106. Epi growth hereby might start with or without a low doped layer, acting as porosification stop layer, followed by a layer with high doping concentration. The epi can also include a multilayer stack with strongly varying doping levels and/or doping species as well as with vertical doping concentration gradients to induce depth of various degree of porosification in the subsequent porosification process. Applying the porosification process to the epitaxial layer(s) 106 has at least the following advantages: (i) the porosification can be controlled via different dopant concentrations within the epitaxial layers 106; and (ii) a part of the semiconductor wafer 100 is not transformed, that is to say, after exfoliation/separation, the wafer 100 continues to have the same initial thickness and may be reused infinite times without any wafer re-thickening.

Step (d): Frontside Processing

Device preparation follows the epitaxial growth. The required doping regions of the device may be produced by implantation in the epitaxial layers 106 and/or by doping during the epitaxial process. The device structures 111 may be structures of a semiconductor device, e.g., a diode such as an MPS (Merged p-i-n/Schottky) diode or a Schottky diode, or a power transistor device such as a MOSFET (metal-oxide-semiconductor field-effect transistor), JFET (junction field-effect transistor), IGBT (insulated gate bipolar transistor), FINFET (fin field-effect transistor), etc., or even a combination thereof. If the device structures 111 comprise a Schottky contact, a frontside metallization may comprise a Schottky contact metal. In addition or as an alternative, and in the case of no Schottky contact, the frontside metallization may comprise an Ohmic contact metal.

For example, the first deposited epitaxial layer 106 may be an n-doped drain or emitter layer with a thickness in a range of 10 μm to 50 μm for power-MOSFETs or power diodes or a p-doped emitter layer in the case of IGBTs. A second epitaxially deposited layer 106 may be a buffer layer, which prevents punch-through of the space charge layer towards the backside emitter or drain layer. The thickness of the buffer layer may be in a range of 2 μm to 30 μm. An n-type drift zone layer 106 may be deposited by epitaxial techniques on the buffer layer or on the n-doped drain or emitter layer if the buffer layer is omitted. The thickness of the drift zone layer depends on the targeted breakdown voltage. For 1200 V devices, the thickness of the drift zone layer may be in a range of 12 μm. For 3.3 kV devices, the thickness of the drift zone layer may be in a range of 35 μm. The doping level of the drift zone layer may be adjusted according to the desired breakdown voltage. For 1200 V devices, the doping level of the drift zone layer may be in a range of about $10 \times 16$ cm$^{-3}$. For 3.3 kV devices, the doping level of the drift zone layer may be in a range of a few times $10 \times 15$ cm$^{-3}$. Further front-side structures 111 such as p-body regions and n-type source regions for power MOSFETs or IGBTs, or p-emitter for power diodes, may be realized by masked ion implantation with subsequent annealing steps at high temperatures, e.g., above 1500° C. For switchable devices, a gate structure may be realized additionally which may be planar or trench-based.

The individual epitaxial layers 106 described above may be grown in a single epitaxial growth process, optionally with adaption of the epitaxial conditions throughout the process, or in several epitaxial processes with other intermediate processing steps. The device structures 111 may be processed until a frontside metallization and/or passivation layers are applied. Accordingly, after the frontside processing step (d), the substrate 108 has a frontside with the device structures 111 and possibly frontside metallization and/or passivation layers. The backside of the substrate 108 corresponds to the backside of the semiconductor wafer 100. After frontside device preparation, the entire substrate 108 comprises the semiconductor wafer 100 with the porous layer(s) 102, the epitaxial layer(s) 106 including the device structures 111, and optionally frontside metallization and/or passivation structures.

Before the frontside carrier 112 is attached or even before frontside metallization is deposited, dicing streets may be porosified, e.g., by forming a vertical porous layer in the course of the frontside device processing, e.g., before the exfoliation/separation step (f) to reduce side wall damage and Kerf-loss which are generated in conventional separation techniques (e.g., laser, mechanical) which come along with unwanted effects.

Step (e): Frontside Carrier

FIG. 8 illustrates an embodiment of the substrate 108 before the exfoliation/separation step (f). A carrier 112 is attached to the frontside of the substrate 108. The carrier 112 mechanically stabilizes the substrate 108 during and after the exfoliation/separation step (f). The carrier 112 may be attached to a frontside metallization 600. Materials options and dimensions of the carrier 112 are described in more detail later herein.

A further embodiment includes performing the singulation (chip separation) step (m) prior to both the exfoliation/separation step (f) and the backside conditioning and metallization steps (h), (i) on already separated dies 126 supported by the frontside carrier 112, e.g., as shown in FIG. 4. According to this embodiment, a permanent or temporary backside carrier or supporting structure 122 may be omitted.

Step (f): Exfoliation/Separation

After device preparation, the non-porous part 110 of the semiconductor wafer 100 is exfoliated/separated from the remainder 108' of the wafer 100. The porous layer(s) 102 act as a separation start point where one or more cracks are induced. Accordingly, no additional crack induction, e.g., with laser radiation is required. However, such additional means may still be used in the final process, e.g., pulsed laser radiation may be focused to the position of the porous layer(s) 102, where the laser radiation is absorbed in a linear or non-linear absorption process and results in modifications in the semiconductor material. Optionally, the laser absorption within the porous layer(s) 102 may be enhanced by a high doping level within the porous layer(s) 102. For example, typical acceptor or donor dopants can be chosen or also dopants with a deep energy level such as vanadium (V) and/or titanium (Ti) and/or by the creation of carbon or graphenic layers on pore sidewalls within the porous layer(s) 102 by an adequate thermal treatment of the porous layer(s) 102. Further measures may be used to facilitate the exfoliation/separation step (f) such as a proton or helium implantation into the porous layer(s) 102 to enhance pore density and/or the stress in a certain depth of the porous layer(s) 102.

If there is a vertical variation of pore density, e.g., by varying pore size and pore distance, the split/separation takes place in the region where the porosified layer(s) 102 is least stable, e.g., where pore density is highest or where the pore structure allows for easiest splitting, e.g., is weakest. For the case that the least stable porous layer 102 is located in deeper regions of the porous layer stack, which can be helpful for a defect-free epitaxial SiC-growth on the skin layer, the splitting/separation occurs overwhelmingly in the region of the weakest porous layer 102 so that a certain part of the porous layer 102 may remain on the backside of the wafer 100 after splitting/separation. Further backside conditioning may be required, e.g., as described in more detail later herein.

Typically, separation starts at the porous layer 102 or the least stable porous layer and one or more cracks are guided through the semiconductor material, preferably along the porous layer 102 or the least stable porous layer 102. The crack(s), however, could also leave the porous layer 102 or least stable porous layer 102 and enter the neighboring semiconductor material. If the crack(s) leaves in the direction of the underlying semiconductor wafer 100, the damage may be removed in a later refurbish process step. The crack(s) could also leave in the direction of the device layers. In this case, a further crack-stop layer might be advantageous, where the crack-stop layer may be positioned between the porous layer(s) 102 and the device layers. Such a crack-stop layer may, for example, be produced by anodic oxidation of a part of the porous layer 102 next to the device layers after the device layers have been produced. Such a crack-stop layer may in addition or as an alternative, be located at the wafer side of the porous layer(s) 102. Alternatively, the semiconductor layers (porous or non-porous) between the porous layer(s) 102 and the device layers may be chosen thick enough to prevent that the crack(s) from extending into the device layers.

For separating the non-porous part 110 of the semiconductor wafer 100 from the remainder 108' of the substrate 109, an external force may be applied to the substrate 108 to induce at least one crack along the porous layer(s) 102. Several methods may be used alone or in combination for applying the external force.

In one embodiment, the external force is applied by thermo-assisted splitting. A layer, either organic based, inorganic based or a combination, with different thermal expansion coefficient (CTE) than the substrate 108 or wafer material, in particular the porous semiconductor material, is applied to the wafer 100/substrate 108. The layer may be a polymer, metal, hybrid polymer, ceramic (e.g., in particular polymer). The layer may be attached to the backside or frontside or even both sides of the substrate 108. Depending on the choice of layer, either cooling or heating may be used to generate a stress over/on the wafer/substrate 100/108 to separate the non-porous part 110 of the semiconductor wafer 100 from the remainder 108' of the substrate 108.

In another embodiment, the external force is applied by a thermal gradient. One side of the substrate 108 may be cooled. Optionally, the other side of the substrate 108 may be heated. The thermal gradient results in stress in the material which fractures along the porous layer(s) 102, which is different than the thermo-assisted splitting embodiment where stress is generated due to CTE mismatch.

In another embodiment, the external force is applied by a water and/or air jet. Fluid driven separation is implemented by either water (e.g., similar as ELTRAN® from Canon) or with a gas. The fluid (e.g., water/gas) is applied preferably to the porous layer(s) 102, at an edge of the substrate 108.

In another embodiment, the external force is applied by laser cutting at least partially from the edge of the substrate 108. A laser may be focused from the edge of the substrate 108 at the porous layer(s) 102 such that the focal point is at the porous layer(s) 102. The laser wavelength may be chosen such that absorption is maximum at the porous layer(s) 102. The laser processing may be combined with the absorption enhancement in the porous layer(s) previously described herein. For example, the doping concentration of the one or more porous layers 102 may be modified such that a maximum absorption of the laser light occurs within the one or more porous layers 102.

In another embodiment, the external force is applied by pressure. Similar to a nut opening machine but the wafer 100 must be held. For example, both sides of the substrate 108 may be fixed in a chamber and high pressure is applied to the chamber environment. Abrupt (very fast) pressure release results in one or more cracks forming at the weakest layer which is the one or more porous layers 102.

In another embodiment, the external force is applied by etching. The porous layer(s) 102 may be removed with an etchant, for example a liquid etchant. The etchant may be chosen such that the etchant etches the porous semiconductor material faster (e.g., at least 10 times faster) than the non-porous semiconductor material 110. Possible etchants may be alkaline (e.g., KOH, TMAH) or fluorine based ($NH_4F$, HF, $HBF_4$). Alternate between etching and water rinse may be implemented to etch only the porous layer(s), e.g., etching-rinsing-drying-etching-rinsing, etc.

In another embodiment, the external force is applied by immersion in fluid and cooling. The substrate 108 may be immersed in fluid having a higher volume at lower temperatures (e.g., in frozen aggregate state) than at higher temperatures (e.g., liquid aggregate state). For example, the fluid may be water. The fluid penetrates the pores at the open edge of the substrate 108. The fluid may be cooled down such that the fluid expands and results in damage of the porous layer(s) 102. The process works for outer parts such that repetition of the process is carried out, e.g., immersion-cooling-immersion-cooling, etc. and/or combination with other processes.

In another embodiment, the external force is applied by oxidation. Via a routine oxidizing of the porous layer(s) 102 and etching and rinsing in a closed loop until the surface is completely removed, e.g., oxidizing-etching-rinsing-drying-oxidizing-etching . . . etc. After the porosification, an oxidation process including a CMP treatment afterwards may be performed to expose the skin layer for the epi growth.

In another embodiment, the external force is applied by ultrasonic vibrations. For example, sound waves may be applied to the substrate 108. The waves may have a frequency in the kHz regime, e.g., at least 20 kHz and at most 60 kHz, e.g., 30-50 kHz, e.g., 35-45 kHz. To apply the ultrasonic waves, the substrate 108 may be kept in a container filled with a fluid, e.g., pure water. The ultrasonic generator for applying the ultrasonic waves may be a device similar to an ultrasonic cleaning apparatus, for example.

In another embodiment, the external force is applied by a torsional stress. While the substrate 108 is secured in place, a torsional force is applied to the one or more porous layers 102. For example, the substrate 108 may be attached to a chuck holder, e.g., with adhesive forces. The substrate 108 is then twisted to induce stress via the chuck holder with respect to the wafer 100.

In another embodiment, the external force is applied by mechanical lift-off. While the substrate 108 is secured in place, a sheer force is applied to the one or more porous layers 102. For example, the substrate 108 may be attached to a rigid carrier and a leverage force is used to exfoliate/separate the non-porous part 110 of the wafer 100 from the remainder 108' of the substrate 108.

In another embodiment, the external force is applied by a pulling force. While the substrate 108 is secured in place, a tensile force is applied to the one or more porous layers 102. For example, a chuck holder (or similar structure) may be attached to the substrate 108 with a strong adhesive. A tensile force is applied to the chuck holder and at the substrate 108. Instead of a chuck holder, a tape could be used, e.g., on only one side, e.g., in combination with the chuck, or on both sides.

In another embodiment, the external force is applied by electromagnetic (pulling) forces. The substrate 108 may be attached (e.g., adhesively) to an electrode (negative or positive) where the wafer 100 has some doping level, which makes it attractive to a potential. A further electrode is positioned above the wafer 100 and high voltage is applied between the two electrodes, thus attracting the substrate 108 to the upper electrode. The upper part of the substrate 108 is torn from the lower part of the substrate 108 by these forces, wherein the porous layer(s) 102 acts as a weak point. The substrate 108 may be positioned such that the backside is face up or the frontside is face up, depending on if the device substrate 116 should be drawn to the upper electrode or if the reclaim wafer 114 should be drawn to the upper electrode. Two electrostatic chucks may be used to generate the fracture in between of the porous layer(s) 102.

Step (g): Refurbish of Reclaim Wafer

After the exfoliation/separation process (f), the reclaim wafer 114 may be refurbished, e.g., as described above in connection with the wafer preparation step (a). For example, the reclaim wafer 114 may require conditioning for epitaxial growth (refurbish). Conditioning of the device substrate 116 is described in further detail later herein. An epi-ready wafer may require a surface roughness with a rms (root-mean-square) value below 50 nm, e.g., below 30 nm, e.g., below 10 nm, e.g., or even below 5 nm or 1 nm.

After the exfoliation/separation process (f), remaining parts (e.g., remainders, residues, residual porous parts, etc.) of the porous layer(s) 102 may be present at the separation surface of the reclaim wafer 114 and at the separation surface of the device substrate 116. Also, the surfaces may be rough due to the exfoliation/separation process. In addition or as an alternative to the general treatment options described above in connection with the wafer preparation step (a), the following optional steps may be used.

At least part of the residual porous parts of the porous layer(s) 102 may be removed, e.g., with one of the methods described above in connection with the wafer preparation step (a). The porous material may be etched selectively compared to the non-porous material because the porous material has a roughly 1000× larger surface area due to the porous structure and the etching rate is correlated to the surface area. The parameters of the porosification can be chosen in-situ such that the porous layer(s) 102 is unstable and flakes off, or can be peeled off mechanically. Thermal oxidation at about 1200° C. of the porous layer(s) 102, e.g., 10-20 nm is sufficient for complete oxidation followed by removal of the formed oxide. The porous layer(s) 102 can also be removed by grinding/polishing. In this case, cost savings are the main consideration, since the porous layer(s) 102 is much more unstable. Damage implantation and subsequent wet chemical etching, e.g., with $HF/HNO_3$ may be used. This method is particularly suitable for layer thicknesses in the range of 1 μm. With the help of the deposition of a metal layer, e.g., Ti, Ni, Mo and a temperature step, silicidation takes place and in the subsequent step, the formed carbon and metal silicide can be removed. Typically, the porous layer(s) is first removed with at least one of the above methods and the surface is smoothed/prepared afterwards, e.g., with CMP or some other surface preparation method. The thickness of the reclaim wafer 114 may also be increased by either depositing a monocrystalline, e.g., SiC layer onto the wafer frontside surface or by depositing a monocrystalline, e.g., SiC layer, a polycrystalline, e.g., SiC layer, or a combination of mono- and polycrystalline, e.g., SiC layers onto the wafer backside, e.g., as previously described herein in connection with epitaxy step (c). Depending on the exfoliation/separation method, bevel reshaping may be required, e.g., grinding, sawing, plasma etching, laser ablation, EDM/ECDM (electrical [chemical] discharge machining), etc.

Figure 9:
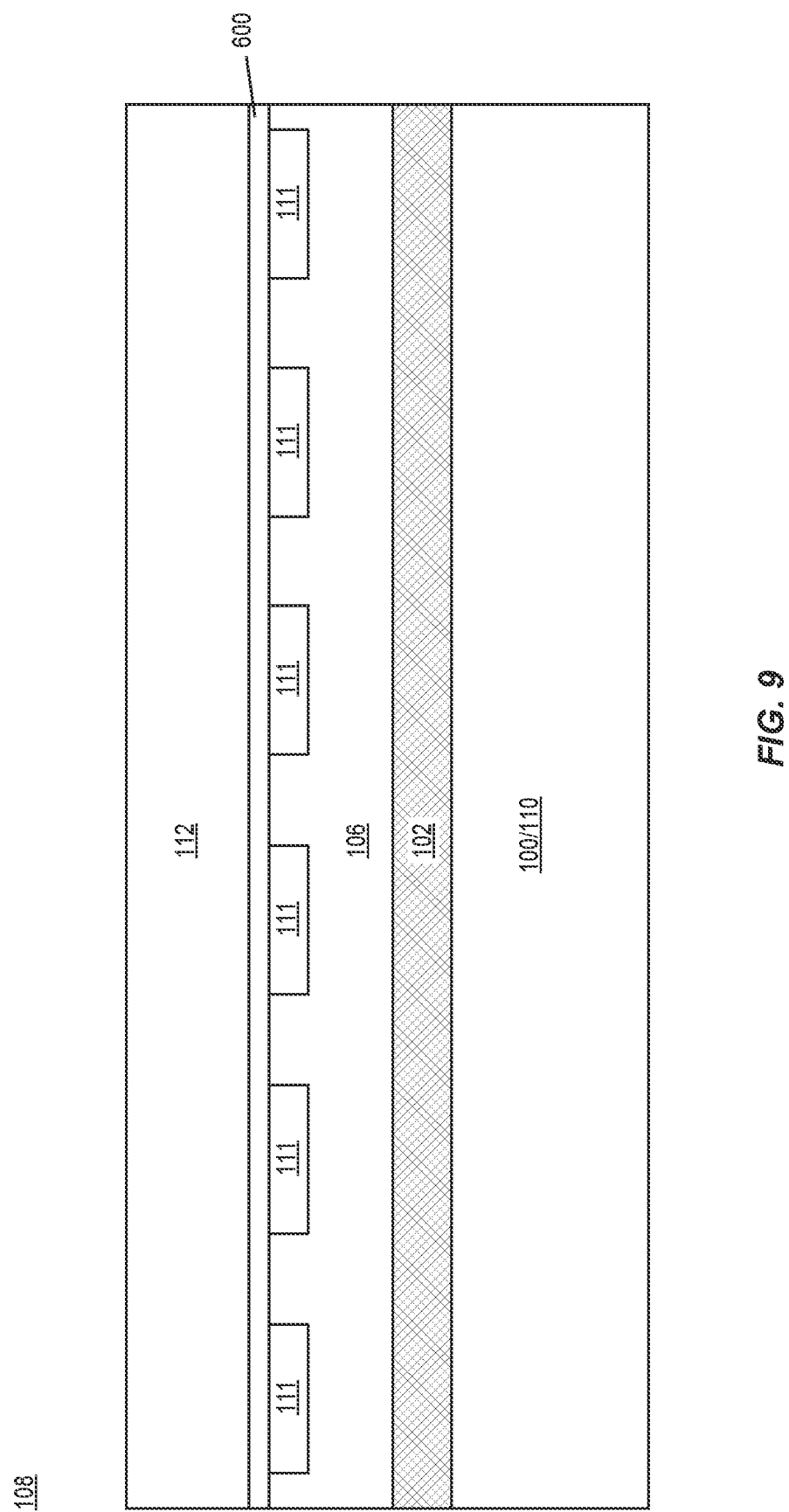
FIG. 9 illustrates a partial cross-sectional view of an embodiment of a device substrate attached to a frontside carrier.

After the exfoliation/separation step (f), the device substrate 116 comprises the epitaxial layer(s) 106 including the device structures 111 and (optionally) the frontside metallization and/or passivation structures. The device substrate 116 still may be attached to the frontside carrier 112, e.g., as shown in FIG. 9. Optionally, at the backside, the device substrate 116 may comprise portions of the porous layer(s) 102 and/or the wafer 100.

A thickness of the device substrate 116 after exfoliation/separation may be at least 5 μm and at most 100 μm, for example. After backside conditioning, the thickness of the device substrate 116 may be decreased even further by at least 500 nm, depending on the thickness of any remaining porous layer 102. Handling of such an extremely thin device substrate is very challenging in the following process steps.

Step (h): Backside Conditioning

The backside of the device substrate 116, i.e., the side where exfoliation/separation took place, may comprise residual porous parts of the porous layer(s) 102 and/or residual parts of the wafer 100. The backside of the device substrate 116 may further have damages similar to the damages of the reclaim wafer 114, e.g., higher surface roughness.

The residual porous parts of the porous layer(s) 102 and possibly residual parts of the wafer 100 may be removed, or at least parts of the porous layer(s) 102 may remain at the backside of the device substrate 116. In some embodiments, processing of the device substrate 116 starts with a damage removal at the backside to remove the residual porous parts of the porous layer(s) 102 and possibly residual parts of the wafer 100. Damage removal may, e.g., comprise mechanical grinding and/or chemical mechanical polishing (CMP) and/or etching or other mechanical methods, e.g., sand blasting, water jetting, etc. At least some of the general treatment options described above in connection with the wafer preparation step (a) may be used for conditioning the backside of the device substrate 116. The final roughness of the backside surface may have an rms value of below 2 μm, e.g., between 1 nm and 100 nm or even below 50 nm.

Additionally or as an alternative, residual porous parts of the porous layer(s) 102 and possibly residual parts of the wafer 100 may remain at the backside of the device substrate 116. The backside of the device substrate 116 may be porosified again to create a backside porous layer. This additional porosification may be performed either with the residual porous parts of the porous layer(s) 102 and possibly residual parts of the wafer 100 still being present at the backside or after removal of such residual parts. This may result in a roughened backside, e.g., rms value above 50 nm or above 100 nm or above 500 nm. A roughened backside may, additionally or alternatively, be created by other means than a backside porous layer, e.g., by mechanical and/or chemical treatment. A rough backside surface structure may be helpful to achieve a better ohmic contact and/or a better adhesion between the (subsequently formed) backside metallization and the semiconductor material of the device substrate 116.

Step (i): Backside Metallization

After backside conditioning, an ohmic backside contact may be deposited and the required contact structures at the backside of the device substrate 116 may be finalized. Ohmic contacts may be formed by application of at least one of: implantation; annealing; and metallization of the device substrate backside. All equipment used may be capable of either processing wafers attached to the frontside carrier 121 or other options described previously herein in connection with the frontside processing (d).

Steps (j), (k) and (l): Backside Carrier Attachment, Frontside Carrier Removal, and Testing Possibilities for further ultra-thin wafer processing in the backend-of-line process (after metallization) includes continuing with the frontside carrier 112 and only remove the frontside carrier 112 after the device substrate 116 is attached to a sawing tape. In this case, electrical testing (l) occurs prior to the attachment of the frontside carrier 112 or only at the die level in backend, e.g., as illustrated in FIG. 3. The frontside carrier 112 instead may be exchanged with a permanent supporting structure on the backside of the device substrate 116 in accordance with the device geometry, e.g., a backside carrier 112, extensive (thick) backside metallization, a glass ring, e.g., as illustrated in FIGS. 1 and 2.

Depending on the process flow, a carrier 122 may be attached to the backside of the device substrate 116. The backside carrier 122 may be removed after the testing step (l). In this case, the backside carrier 1122 is a temporary carrier. Alternatively, at least portions of the carrier 122 may remain at the backside of the device substrate 116 during further processing steps or even in the final product. In this case, the backside carrier 122 is a permanent carrier.

Depending on the choice of frontside carrier 112, the frontside carrier 112 may be fully removed from the device substrate 116 before or after the testing step (l), or at least a portion of the frontside carrier 112 may remain at the device substrate 116. This may, e.g., be the case if the remaining portion of the frontside carrier 112 does not fully cover the frontside surface f the device substrate 116 and leaves electric contacts of the device structures 111 accessible for the electrical testing step (l). For example, if the frontside carrier 112 comprises or is a grid, the electric contacts of the device structures 111 may be accessible through openings of the grid and the testing step (l) may be performed even with the grid of the frontside carrier 112 attached to the device substrate 116. The same is true for a frontside carrier 112 that follows the shape of a ring. In such a case, where a portion of the frontside carrier 112 remains at the device substrate 116, the frontside carrier 112 or at least a portion of the frontside carrier 112 may be removed after the testing step (l) or may even remain at the device substrate 116 during the singulating step (m) and residues of the frontside carrier 112 may be present in the final device. For example, the singulating step (m) be performed through the frontside carrier 112. After all frontside and backside processing steps are carried out, the devices may undergo the electrical testing step (l). However, the testing step (l) may be performed earlier as shown in FIG. 4.

Steps (m) and (n): Singulating and Further Backend Assembly

After the testing step (l), the device substrate 116 is diced into individual dies (chips) 126 along a so-called kerf region of the device substrate 116. Each die 126 may comprise, e.g., at least one transistor and/or diode cell. Dicing may be performed by using a mechanical saw, ultrasonic dicing, laser dicing, scribe and break, reactive ion etching, etc.

For porosification, the wafer edge (bevel) may or may not be excluded from processing. Prior to the exfoliation/separation step (f), a proper edge connection—lateral access to the porous layer(s) 102—should be assured by bevel treatment, e.g., mechanical, chemical, laser or fluid assisted bevel treatment. After the exfoliation/separation step (f), and when processing ultrathin wafers, special precaution should be taken on the wafer edge geometry and the embedding of the sensitive wafer edge (wafer bevel) throughout the processing.

Carrier Embodiments

Each of the carriers described in the following may be a single piece of material or may be a carrier system that comprises multiple layers and/or complex structures. The frontside and/or backside carrier 112, 122 provides mechanical stabilization to the whole substrate 108 during and/or after processing. The shape of the carrier 112, 122 may be similar or even identical to the shape of the substrate 108. In some embodiments, the carrier 112, 122 may have a larger diameter than the substrate 108, e.g., at least 0.1% larger. For example, in such embodiments, the carrier 112, 122 may protect the bevel of the wafer 100. In other embodiments, the carrier 112, 122 may have a diameter that is at most, e.g., 80% of or 90% of or 100% of the diameter of the substrate 108. For example, the carrier 112, 122 in this case may be or may comprise a thick metal on the back side of the substrate 108. The diameter of the carrier 112, 122 may, e.g., be the largest diameter, e.g., for non-symmetrical and/or non-circular carriers.

The carrier 112, 122, e.g., either the mechanically stabilizing part of the carrier 112, 122 and/or an optional fixing layer of a carrier system, may either fully cover the substrate 108, e.g., the frontside or the backside, or the carrier 112, 122 may divide the covered surface into sections along the surface of the substrate 108. In the latter case, the mechanically stabilizing part and/or the optional fixing layer of the carrier 112, 122 may have the shape of a ring, a grid, and/or may only be present in peripheral regions of the substrate 108, e.g., an intersected ring at the outer part of the substrate 108. The carrier 112, 122 may be either reversible or permanently joined to the substrate.

A reversible carrier system may be: an adhesive tape (thermo release, UV release, solvent release); an adhesive (organic or inorganic composition) layer in combination with a rigid support (e.g. transparent substrate, non-transparent substrate, polymer film); a fixed or mobile electrostatic chuck; a fixed or mobile vacuum chuck; a mobile vacuum carrier; a magnetic based carrier.

A permanent carrier system may be attached, e.g., via organic and/or inorganic adhesive (glass frit may be organic before burning and inorganic after burning), other attachment options described below. For a glass carrier, e.g. glass grid/ring, the permanent carrier system may be attached via solder glass or laser welding process which may require an additional absorption layer between the glass carrier and the substrate 108 to allow for absorbing the laser light. The permanent carrier system may be attached via aerobic and or anaerobic adhesives, diffusion soldering layer(s), etc. Materials for the permanent carrier system may be include glass, e.g., hot embossed glass such as in the form of a glass grid, a glass ring etc., semiconductor, e.g., Si, polysilicon, SiC, poly SiC, etc., metal, insulator, e.g. glass, etc. The shape of the permanent carrier system may be a structured supporting system, aligned with the kerf region of the front side. Alignment with the kerf region results in alignment with some of the frontside structures 11, so that later processing, e.g., dicing can be done with the carrier attached. This is, e.g., the case for a grid-like structure where the grid lines are aligned with the kerf region of the substrate [chips]); glass grid as one option. The permanent carrier system may have the shape of a glass grid and/or ring.

The frontside carrier 112 provides mechanical stabilization to the whole substrate 108 during exfoliation/separation and to the device substrate 116 after exfoliation/separation. The frontside carrier 112 also protects the device structures 111 at the front side. Possible materials for the frontside carrier 112 may be Si, SiC, glass, poly SiC, ceramics, magnetic materials, polymer films. Polymer films may have a thickness of up to a few 10 µm or even a few 100 µm. The topography of the device structures 111 may be embedded, e.g., by means of a potting material and/or an adhesive layer and/or a non-adhesive layer between the carrier 112 and the substrate 108 or in openings of the carrier 112, e.g., in openings of a grid-shaped carrier or a ring-shaped carrier. If a (e.g., glass) grid or a (e.g., glass) ring is used as the frontside carrier 112, and if thermo-assisted splitting is used for exfoliation/separation, the exfoliation/separation may comprise applying a layer at the backside of the substrate 108 and additionally at an outer side of the carrier 112 that faces away from the substrate 108, e.g., similar to a sandwich.

The backside carrier 122 mechanically stabilizes the device substrate 116 during the testing step (l) and during subsequent process steps. The backside carrier 122 may include electric structures, e.g., contact pads to allow for electric testing. After the testing step (l), the backside carrier 122 may be removed from the backside of the substrate 108/116 or may remain at the substrate 108/116. If the backside carrier 122 is removed from the substrate 108/116, the following carriers may be used: ring on the peripheral area; mobile vacuum chuck; mobile electrostatic chuck; mobile GelPak chuck; conductive tapes. If the backside carrier 122 remains at the substrate 108/116, the following carriers may be used: the carrier 122 may comprise conductive portions, e.g., made from a metal that are aligned with the devices at the front side. In between the conductive portions, the carrier 122 may comprise a material that can be singulated and that is aligned with the so-called kerf of the device substrate 116, through which singulation, e.g., dicing, breaking, lasering, etc. is performed. The backside carrier 122, e.g., the conductive portions of the carrier 122, may be soldered to the backside metallization 120. After singulation, the conductive portions are still in contact with the device structures 111.

A combination of the embodiments described above for the front and backside carriers supporting solutions might also be used, either on both sides or on one side, e.g., very thick backside metal in combination with ring structure or glass grid on the frontside, or glass grid may be provided at the backside and the openings may be filled with the conductive material.

Various embodiments of the non-ablative multi beam splitting technique, the subcritical crack technique, and the shape change compensation technique are described herein. Each of these embodiments may be used in conjunction with any of the other embodiments, unless expressly stated otherwise.

Although the present disclosure is not so limited, the following numbered examples demonstrate one or more aspects of the disclosure.

Example 1. A method of processing a semiconductor wafer, the method comprising: forming one or more epitaxial layers over a first main surface of the semiconductor wafer; forming one or more porous layers in the semiconductor wafer or in the one or more epitaxial layers, wherein the semiconductor wafer, the one or more epitaxial layers and the one or more porous layers collectively form a substrate; forming doped regions of a semiconductor device in the one or more epitaxial layers; and after forming the doped regions of the semiconductor device, separating a non-porous part of the semiconductor wafer from a remainder of the substrate along the one or more porous layers.

Example 2. The method of example 1, wherein forming the one or more porous layers comprises: porosifying semiconductor material of the semiconductor wafer or of the one or more epitaxial layers.

Example 3. The method of example 2, wherein the porosifying comprises an electrochemical process that uses an electrolytic solution.

Example 4. The method of example 3, wherein the electrolytic solution comprises a fluorine-based chemistry or an alkaline etch chemistry.

Example 5. The method of example 3 or 4, wherein the electrochemical process is an anodic porosification process driven by ultraviolet radiation.

Example 6. The method of any of examples 3 through 5, further comprising: varying a current and/or a voltage of the electrochemical process and/or a composition of the electrolytic solution, such that a porosity of the one or more porous layers varies in a direction perpendicular to the first main surface of the semiconductor wafer.

Example 7. The method of any of examples 2 through 6, wherein the porosifying comprises inducing charge carriers within the semiconductor material via an electric field.

Example 8. The method of any of examples 2 through 7, further comprising: prior to the porosifying, modifying a doping concentration of the semiconductor material to be porosified.

Example 9. The method of example 8, wherein modifying the doping concentration of the semiconductor material to be porosified comprises increasing the doping concentration of the semiconductor material to be porosified.

Example 10. The method of example 8 09, wherein modifying the doping concentration of the semiconductor material to be porosified comprises adjusting one or more of a plurality of implantation energies, a plurality of implantation angles, and a plurality of channeling implants.

Example 11. The method of any of examples 8 through 10, wherein modifying the doping concentration of the semiconductor material to be porosified comprises varying a vertical doping concentration and/or a lateral doping concentration of the semiconductor material to be porosified.

Example 12. The method of any of examples 1 through 11, wherein the one or more porous layers are formed in the semiconductor wafer such that the semiconductor wafer has a porous part that includes the one or more porous layers and the non-porous part which excludes the one or more porous layers.

Example 13. The method of example 12, further comprising: after separating the non-porous part semiconductor wafer from the one or more epitaxial layers along the one or more porous layers, reusing the non-porous part of the semiconductor wafer.

Example 14. The method of any of examples 1 through 11, wherein the one or more porous layers are formed in the one or more epitaxial layers, and wherein the entire semiconductor wafer is non-porous and separated from the one or more epitaxial layers along the one or more porous layers.

Example 15. The method of example 14, further comprising: after separating the entire semiconductor wafer from the one or more epitaxial layers, reusing the entire semiconductor wafer.

Example 16. The method of example 14 or 15, further comprising: varying a porosification rate within the one or more porous layers by varying a dopant concentration within the one or more epitaxial layers.

Example 17. The method of any of examples 1 through 16, wherein forming the one or more porous layers comprises forming a stack of porous layers with different pore sizes in the semiconductor wafer or in the one or more epitaxial layers.

Example 18. The method of example 17, wherein forming the stack of porous layers with different pore sizes comprises vertically and/or laterally varying a doping concentration of semiconductor material to be porosified.

Example 19. The method of any of examples 1 through 18, further comprising: varying a porosity of the one or more porous layers in a direction perpendicular to the first main surface of the semiconductor wafer.

Example 20. The method of any of examples 1 through 19, wherein forming the one or more porous layers comprises: forming a first porous layer having a first average pore density; and forming a second porous layer above the first porous layer, the second porous layer having a second average pore density that is less than the first average pore density.

Example 21. The method of example 20, wherein forming the one or more epitaxial layers comprises forming the one or more epitaxial layers on the second porous layer.

Example 22. The method of example 21, wherein the second porous layer is monocrystalline, has an average pore diameter below 200 nm, and has a thickness in a range of 20 nm to 500 nm.

Example 23. The method of example 21 or 22, wherein the first porous layer has a thickness in a range of 1 µm to 10 µm.

Example 24. The method of any of examples 20 through 23, wherein the second average pore density is such that an average distance between pores of the second porous layer is larger than an average diameter of the pores.

Example 25. The method of any of examples 20 through 24, wherein the separating comprises separating the non-porous part of the semiconductor wafer from the remainder of the substrate along the first porous layer.

Example 26. The method of any of examples 20 through 25, wherein an average doping concentration of the first porous layer is greater than an average doping concentration of the second porous layer, and wherein the average doping concentration of the second porous layer is greater than an average doping concentration of the semiconductor wafer.

Example 27. The method of any of examples 20 through 26, wherein the first porous layer and the second porous layer are structured and/or have a varying thickness.

Example 28. The method of any of examples 20 through 27, further comprising: compensating n-type doping in the second porous layer by acceptor implantation or by implanting vanadium and/or titanium impurities.

Example 29. The method of any of examples 20 through 28, wherein forming the second porous layer above the first porous layer comprises: forming a low-doped epitaxial layer on the first porous layer; forming a mask on the low-doped epitaxial layer; and implanting dopants into the low-doped epitaxial layer through openings in the mask and at an electric field strength that induces pore formation in regions of the low-doped epitaxial layer aligned with the openings in the mask.

Example 30. The method of any of examples 20 through 29, wherein forming the one or more porous layers further comprises: forming an additional porous layer below the first porous layer and having an average pore density that is less than the first average pore density.

Example 31. The method of any of examples 20 through 30, wherein forming the one or more porous layers further comprises: forming an additional porous layer between the first porous layer and the second porous layer and having an average pore density that is less than the first average pore density and greater than the second average pore density.

Example 32. The method of any of examples 1 through 31, wherein forming the one or more porous layers comprises: forming a low conducting epitaxial layer, a low conducting wafer region, or a low conducting buried wafer region induced by implantation of a dopants which provide counter-doping; forming a higher conducting layer on the low conducting epitaxial layer, low conducting wafer region, or low conducting buried wafer region, the higher conducting layer having a higher average doping concentration than the low conducting epitaxial layer, low conducting wafer region, or low conducting buried wafer region; and forming a homogenous porous layer in the higher conducting layer.

Example 33. The method of example 32, wherein a thickness variation of the homogenous porous layer is less than ±1 µm.

Example 34. The method of any of examples 1 through 33, wherein forming the one or more porous layers comprises: forming a mask on an epitaxial layer or on the first main surface of the semiconductor wafer; implanting dopants through openings in the mask; and applying an electric field that accelerates vertical porosification in regions where the dopants were implanted.

Example 35. The method of any of examples 1 through 34, wherein forming the one or more epitaxial layers comprises: forming a first epitaxial layer by epitaxial lateral overgrowth of pores in an uppermost one of the one or more porous layers.

Example 36. The method of example 35, wherein the first epitaxial layer has a lateral dopant concentration that varies based on pore location in the uppermost one of the one or more porous layers.

Example 37. The method of example 35 or 36, wherein forming the doped regions of the semiconductor device in the one or more epitaxial layers comprises: forming a drain or emitter layer above the first epitaxial layer; forming a buffer layer on the drain or emitter layer; and forming a drift layer on the buffer layer.

Example 38. The method of example 37, wherein the drain or emitter layer has a thickness in a range of 10 µm to 50 µm, wherein the buffer layer has a thickness in a range of 2 µm to 30 µm, and wherein the drift layer has a thickness in a range of 12 µm to 35 µm.

Example 39. The method of any of examples 1 through 38, wherein the semiconductor device is a power transistor device.

Example 40. The method of any of examples 1 through 39, further comprising: forming a metallization and/or passivation over the one or more epitaxial layers.

Example 41. The method of any of examples 1 through 40, further comprising: singulating the substrate into a plurality of dies.

Example 42. The method of example 41, wherein the singulating is performed after the separating.

Example 43. The method of example 41 or 42, further comprising: before the separating, attaching a carrier to a side of the substrate opposite the non-porous part of the semiconductor wafer, wherein the carrier remains attached to the substrate during the separating.

Example 44. The method of example 43, wherein the singulating is performed before both the separating and the attaching of the carrier.

Example 45. The method of example 43 or 44, further comprising: before the attaching of the carrier, testing the semiconductor device at the side of the substrate opposite the non-porous part of the semiconductor wafer.

Example 46. The method of any of examples 41 through 46, further comprising: before the separating, forming a first metallization on a first side of the substrate opposite the non-porous part of the semiconductor wafer; after the separating, forming a second metallization on a second side of the substrate exposed by the separating and which is opposite the first side.

Example 47. The method of any of examples 40 through 46, further comprising: before the singulating, porosifiying dicing streets along which the substrate is to be singulated.

Example 48. The method of example 47, wherein the porosifiying of the dicing streets is performed before the separating.

Example 49. The method of any of examples 40 through 48, further comprising: before the separating, attaching a first carrier to a first side of the substrate opposite the non-porous part of the semiconductor wafer; after the separating, forming a metallization on a second side of the substrate exposed by the separating and which is opposite the first side; attaching a second carrier to the metallization; and after the attaching of the second carrier, removing the first carrier.

Example 50. The method of any of examples 1 through 49, further comprising: inducing one or more cracks that extend at least partly in the one or more porous layers, to aid in the separating.

Example 51. The method of example 50, wherein the inducing of the one or more cracks comprises irradiating the one or more porous layers with laser light.

Example 52. The method of example 50 or 51, wherein the inducing of the one or more cracks comprises applying an external force.

Example 53. The method of example 52, wherein the applying of the external force comprises: applying a layer to the substrate, the layer having a different thermal expansion coefficient than the one or more porous layers; and cooling or heating the layer.

Example 54. The method of example 53, wherein the layer is a polymer, metal, hybrid polymer, or ceramic.

Example 55. The method of any of examples 52 through 54, wherein the applying of the external force comprises: applying a thermal gradient across the substrate.

Example 56. The method of any of examples 52 through 55, wherein the applying of the external force comprises: applying a fluid to the one or more porous layers from a side of the substrate.

Example 57. The method of any of examples 52 through 56, wherein the applying of the external force comprises: applying laser light to the one or more porous layers from a side of the substrate.

Example 58. The method of example 57, further comprising: modifying a doping concentration of the one or more porous layers such that a maximum absorption of the laser light occurs within the one or more porous layers.

Example 59. The method of any of examples 52 through 58, wherein the applying of the external force comprises: fixing, in a chamber, the substrate at opposite sides of the substrate; and while the substrate is fixed in the chamber, applying pressure to the chamber environment.

Example 60. The method of any of examples 52 through 59, wherein the applying of the external force comprises: etching the one or more porous layers.

Example 61. The method of example 60, wherein the etching is performed with an etchant that etches the one or more porous layers at least 10 times faster than the non-porous part of the semiconductor wafer.

Example 62. The method of example 61, wherein the etchant is alkaline or fluorine based.

Example 63. The method of any of examples 52 through 62, wherein the applying of the external force comprises: alternating between etching and rinsing of the one or more porous layers.

Example 64. The method of any of examples 52 through 63, wherein the applying of the external force comprises: immersing the substrate in a fluid that has a higher volume at lower temperatures and a lower volume at higher temperatures, the fluid penetrating pores in the one or more porous layer at an edge of the substrate; cooling the fluid such that the fluid expands and damages the one or more porous layers in a region of the edge of the substrate; and repeating the immersing and the cooling until the non-porous part of the semiconductor wafer is removed from the remainder of the substrate.

Example 65. The method of any of examples 52 through 64, wherein the applying of the external force comprises: oxidizing part of the one or more porous layers; etching the oxidized part of the one or more porous layers; rinsing the etched part of the one or more porous layers; and repeating the oxidizing, the etching, and the rinsing until the non-porous part of the semiconductor wafer is removed from the remainder of the substrate.

Example 66. The method of any of examples 52 through 65, wherein the applying of the external force comprises: applying ultrasonic vibrations to the one or more porous layers.

Example 67. The method of example 66, wherein the substrate is in a container filled with a liquid during the applying of the ultrasonic vibrations.

Example 68. The method of example 66 or 67, wherein the ultrasonic vibrations are applied in a frequency range of 20 kHz to 60 kHz.

Example 69. The method of any of examples 52 through 68, wherein the applying of the external force comprises: while the substrate is secured in place, applying a torsional force to the one or more porous layers.

Example 70. The method of any of examples 52 through 69, wherein the applying of the external force comprises: while the substrate is secured in place, applying a sheer force to the one or more porous layers.

Example 71. The method of any of examples 52 through 70, wherein the applying of the external force comprises: while the substrate is secured in place, applying a tensile force to the one or more porous layers.

Example 72. The method of any of examples 52 through 71, wherein the applying of the external force comprises: applying an electromagnetic force to the substrate.

Example 73. The method of example 72, wherein the electromagnetic force is applied to the substrate by a first electrostatic chuck positioned adjacent a first side of the substrate and a second electrostatic chuck positioned adjacent a second side of the substrate opposite the first side.

Example 74. The method of any of examples 1 through 73, further comprising: before the separating, forming one or more carbon and/or graphenic layers on pore sidewalls within the one or more porous layers.

Example 75. The method of example 74, wherein forming the one or more carbon and/or graphenic layers comprises thermally treating the one or more porous layers.

Example 76. The method of any of examples 1 through 75, further comprising: before the separating, implanting proton and/or helium into the one or more porous layers.

Example 77. The method of any of examples 1 through 76, further comprising: before the separating, forming a crack stop layer between the one or more porous layers and a device layer of the one or more epitaxial layers.

Example 78. The method of example 77, wherein forming the crack stop layer comprises: after forming the device layer, performing anodic oxidation of the porous layer closest to the device layer.

Example 79. The method of any of examples 1 through 78, further comprising: before the separating, forming a crack stop layer between the one or more porous layers and the non-porous part of the semiconductor wafer.

Example 80. The method of example 79, wherein the forming of the crack stop layer comprises: performing anodic oxidation of the porous layer closest to the semiconductor wafer.

Example 81. The method of any of examples 1 through 80, wherein a thickness of the remainder of the substrate after the separating is in a range of 5 µm to 100 µm.

Example 82. The method of any of examples 1 through 81, further comprising: after the separating, removing residual porous parts from the remainder of the substrate.

Example 83. The method of example 82, wherein the removing of residual porous parts from the remainder of the substrate comprises: mechanical grinding and/or chemical mechanical polishing and/or etching and/or sand blasting and/or water jetting a surface of the remainder of the substrate defined by the separating from the non-porous part of the semiconductor wafer.

Example 84. The method of example 82 or 83, wherein a surface of the remainder of the substrate defined by the separating from the non-porous part of the semiconductor wafer has a rms (root-mean-square) surface roughness below 2 µm after the removing of residual porous parts from the remainder of the substrate.

Example 85. The method of example 84, wherein the rms surface roughness is in a range of 1 nm to 100 nm.

Example 86. The method of any of examples 82 through 85, further comprising: porosifying a side of the remainder of the substrate from which the residual porous parts were previously removed.

Example 87. The method of example 86, further comprising: forming metallization on the porosified side of the remainder of the substrate.

Example 88. The method of any of examples 1 through 87, further comprising: after the separating, porosifying a side of the remainder of the substrate defined by the separating from the non-porous part of the semiconductor wafer.

Example 89. The method of example 88, further comprising: forming metallization on the porosified side of the remainder of the substrate.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of processing a semiconductor wafer, the method comprising:
    forming one or more epitaxial layers over a first main surface of the semiconductor wafer;
    forming one or more porous layers in the semiconductor wafer or in the one or more epitaxial layers, wherein the semiconductor wafer, the one or more epitaxial layers and the one or more porous layers collectively form a substrate, wherein forming the one or more porous layers comprises:
        forming a low conducting epitaxial layer, a low conducting wafer region, or a low conducting buried wafer region induced by implantation of dopants which provide counter-doping;
        forming a higher conducting layer on the low conducting epitaxial layer, the low conducting wafer region, or the low conducting buried wafer region, the higher conducting layer having a higher average doping concentration than the low conducting epitaxial layer, low conducting wafer region, or low conducting buried wafer region; and
        forming a homogenous porous layer in the higher conducting layer, wherein the low conducting epitaxial layer, the low conducting wafer region, or the low conducting buried wafer region is arranged deeper in the substrate than the homogenous porous layer;
    forming doped regions of a semiconductor device in the one or more epitaxial layers; and
    after forming the doped regions of the semiconductor device, separating a non-porous part of the semiconductor wafer from a remainder of the substrate along the one or more porous layers.

2. The method of claim 1, wherein forming the one or more porous layers comprises porosifying semiconductor material of the semiconductor wafer or of the one or more epitaxial layers, wherein the porosifying comprises an electrochemical process that uses an electrolytic solution, the method further comprising:
    varying a current and/or a voltage of the electrochemical process and/or a composition of the electrolytic solution, such that a porosity of the one or more porous layers varies in a direction perpendicular to the first main surface of the semiconductor wafer.

3. The method of claim 1, wherein forming the one or more porous layers comprises porosifying semiconductor material of the semiconductor wafer or of the one or more epitaxial layers, the method further comprising:
    prior to the porosifying, modifying a doping concentration of the semiconductor material to be porosified.

4. The method of claim 3, wherein modifying the doping concentration of the semiconductor material to be porosified comprises increasing the doping concentration of the semiconductor material to be porosified.

5. The method of claim 1, wherein the one or more porous layers are formed in the semiconductor wafer such that the semiconductor wafer has a porous part that includes the one or more porous layers and the non-porous part which excludes the one or more porous layers.

6. The method of claim 5, further comprising:
after separating the non-porous part semiconductor wafer from the one or more epitaxial layers along the one or more porous layers, reusing the non-porous part of the semiconductor wafer.

7. The method of claim 1, wherein the one or more porous layers are formed in the one or more epitaxial layers, and wherein the entire semiconductor wafer is non-porous and separated from the one or more epitaxial layers along the one or more porous layers.

8. The method of claim 7, further comprising:
after separating the entire semiconductor wafer from the one or more epitaxial layers, reusing the entire semiconductor wafer.

9. The method of claim 1, wherein forming the one or more porous layers comprises forming a stack of porous layers with different pore sizes in the semiconductor wafer or in the one or more epitaxial layers.

10. The method of claim 1, wherein forming the one or more porous layers comprises:
forming a first porous layer having a first average pore density; and
forming a second porous layer above the first porous layer, the second porous layer having a second average pore density that is less than the first average pore density,
wherein the first porous layer and the second porous layer are structured and/or have a varying thickness.

11. The method of claim 1, wherein forming the one or more porous layers comprises:
forming a mask on an epitaxial layer or on the first main surface of the semiconductor wafer;
implanting dopants through openings in the mask; and
applying an electric field that accelerates vertical porosification in regions where the dopants were implanted.

12. The method of claim 1, wherein forming the one or more epitaxial layers comprises:
forming a first epitaxial layer by epitaxial lateral overgrowth of pores in an uppermost one of the one or more porous layers.

13. The method of claim 12, wherein the first epitaxial layer has a lateral dopant concentration that varies based on pore location in the uppermost one of the one or more porous layers.

14. The method of claim 1, further comprising:
singulating the substrate into a plurality of dies,
wherein the singulating is performed after the separating.

15. The method of claim 1, further comprising:
singulating the substrate into a plurality of dies; and
before the separating, attaching a carrier to a side of the substrate opposite the non-porous part of the semiconductor wafer,
wherein the carrier remains attached to the substrate during the separating.

16. The method of claim 15, wherein the singulating is performed before both the separating and the attaching of the carrier.

17. The method of claim 1, further comprising:
singulating the substrate into a plurality of dies;
before the separating, forming a first metallization on a first side of the substrate opposite the non-porous part of the semiconductor wafer;
after the separating, forming a second metallization on a second side of the substrate exposed by the separating and which is opposite the first side.

18. The method of claim 1, further comprising:
inducing one or more cracks that extend at least partly in the one or more porous layers, to aid in the separating,
wherein the inducing of the one or more cracks comprises irradiating the one or more porous layers with laser light.

19. The method of claim 1, further comprising:
inducing one or more cracks that extend at least partly in the one or more porous layers, to aid in the separating,
wherein the inducing of the one or more cracks comprises applying an external force.

20. The method of claim 19, wherein the applying of the external force comprises:
applying a layer to the substrate, the layer having a different thermal expansion coefficient than the one or more porous layers; and
cooling or heating the layer.

21. The method of claim 19, wherein the applying of the external force comprises:
applying a thermal gradient across the substrate.

22. The method of claim 19, wherein the applying of the external force comprises:
applying laser light to the one or more porous layers from a side of the substrate.

23. The method of claim 22, further comprising:
modifying a doping concentration of the one or more porous layers such that a maximum absorption of the laser light occurs within the one or more porous layers.

24. The method of claim 19, wherein the applying of the external force comprises:
applying ultrasonic vibrations to the one or more porous layers.

25. The method of claim 24, wherein the substrate is in a container filled with a liquid during the applying of the ultrasonic vibrations.

26. The method of claim 1, further comprising:
after the separating, removing residual porous parts from the remainder of the substrate.

27. The method of claim 26, wherein the removing of residual porous parts from the remainder of the substrate comprises:
mechanical grinding and/or chemical mechanical polishing and/or etching and/or sand blasting and/or water jetting a surface of the remainder of the substrate defined by the separating from the non-porous part of the semiconductor wafer.

28. The method of claim 26, further comprising:
porosifying a side of the remainder of the substrate from which the residual porous parts were previously removed.

29. The method of claim 28, further comprising:
forming metallization on the porosified side of the remainder of the substrate.

* * * * *

UNITED STATES PATENT AND TRADEMARK OFFICE
CERTIFICATE OF CORRECTION

PATENT NO. : 12,249,504 B2  
APPLICATION NO. : 17/743006  
DATED : March 11, 2025  
INVENTOR(S) : B. Goller et al.

Page 1 of 1

It is certified that error appears in the above-identified patent and that said Letters Patent is hereby corrected as shown below:

On the Title Page

Item (57)/Abstract, Line 1, please change "pa The" to -- The --

Signed and Sealed this
Thirteenth Day of May, 2025

Coke Morgan Stewart
*Acting Director of the United States Patent and Trademark Office*